United States Patent [19]

Henry et al.

[11] 4,141,136
[45] Feb. 27, 1979

[54] METHOD OF FABRICATING SEMICONDUCTOR DEVICES WITH A LOW THERMAL RESISTANCE AND DEVICES OBTAINED BY THE METHOD

[75] Inventors: Raymond Henry; Philippe Morel, both of Paris, France

[73] Assignee: Thomson-CSF, Paris, France

[21] Appl. No.: 766,666

[22] Filed: Feb. 8, 1977

[30] Foreign Application Priority Data

Mar. 11, 1976 [FR] France .................................. 76 06904

[51] Int. Cl.$^2$ .......................................... B01J 17/00
[52] U.S. Cl. .................................... 29/590; 29/589; 357/58
[58] Field of Search .................... 29/589, 590; 357/58

[56] References Cited

U.S. PATENT DOCUMENTS

| | | | |
|---|---|---|---|
| 2,790,940 | 4/1957 | Prince | 357/58 |
| 3,607,468 | 9/1971 | Chang | 357/58 |
| 3,875,657 | 4/1975 | Clarke | 29/80 |

Primary Examiner—W. Tupman
Attorney, Agent, or Firm—Oblon, Fisher, Spivak, McClelland & Maier

[57] ABSTRACT

A method of fabricating highly miniaturized semiconductor devices which must be electrically but not thermally insulated from ground, by replacing the conventional disk of beryllium oxide with a portion of the substrate itself so as to decrease the thermal resistance. To this end one starts with a disk of "PIN"-structure silicon. On one of its faces (P or N as the case may be) one deposits by epitaxy, or forms by successive diffusions, the active layers of the device and the surdoped zones. The "PIN" diode may be reverse biased if it is desired to create a capacity between active layers and metallic support serving as heat sink. Diodes and transistors in high-frequency microelectronics obtained by the method are also described.

3 Claims, 3 Drawing Figures

METHOD OF FABRICATING SEMICONDUCTOR DEVICES WITH A LOW THERMAL RESISTANCE AND DEVICES OBTAINED BY THE METHOD

BACKGROUND OF THE INVENTION

1. Field of the Invention

This invention relates to a method of fabricating semiconductor devices exhibiting a low thermal resistance, and the devices obtained thereby. More particularly, this invention relates to diodes and transistors which it is desired to isolate electrically from ground, while still providing for good elimination of the calories dissipated in the active layers of the semiconductor device.

2. Description of the Prior Art

One method used up to now to obtain the above result consists of inserting a slab of beryllium oxide between the substrate of the device and the metallic support, generally copper, serving as heat sink. Knowing that the energy dissipation in the diodes and transistors takes place at the active layers at a shallow depth in the substrate (5 to 15 microns), the thicknesses of material entering into the calculation of the thermal resistance are, for example, as follows:

100 to 150 microns for the substrate obtained generally by cutting up a disk of semiconductor material which should be of a thickness compatible with the minimal solidity required for manipulation;

600 microns at least for the slab of beryllium oxide which can be no thinner without compromising the solidity of the slab and risking breakage during assembly.

Beryllium oxide is known to have a thermal conductivity about three times greater than that of a semiconductor material such as silicon. The total thickness to take into consideration in calculating the thermal resistance is thus, in the case examined above, equivalent to about 300 to 350 microns of silicon. A thickness of this order contributes to appreciable limitation of the power-handling performance of the device.

SUMMARY OF THE INVENTION

Accordingly, one object of the present invention is to provide a method of fabricating semiconductor devices which permits decreasing the thermal resistance and, consequently, increasing the usable power from a semiconductor device of the aforementioned type.

The invention furnishes a method of fabricating semiconductor devices, of the type comprising a semiconductor region constituting the active portion, the functioning of which leads to the dissipation of calories, a semiconductor substrate, and an electrically insulating support for the active portion intended to carry off the calories toward a heat sink by thermal conduction. The method comprises the following steps:

(a) providing a disk of high-resistivity semiconductor material, (b) creating, by diffusion or epitaxy, a pair of highly doped zones of mutually opposed types of conductivity respectively on the two large faces of the disk, leaving between them a layer of high-resistivity semiconductor material with which the zones form a diode of the "PIN" type;

(c) epitaxially growing a semiconductor layer of the same conductivity type but less strongly doped than one of the zones, starting from the zone;

(d) selectively diffusing impurities into the semiconductor layer to produce a plurality of semiconductor devices;

(e) depositing a metallic film to facilitate connection of the devices to external circuits;

(f) separating the individual devices by cutting up the disk; and (g) mounting each device on a heat-dissipating support.

BRIEF DESCRIPTION OF THE DRAWINGS

The invention will be better understood from the description which follows, and from the accompanying drawings, in which.

DESCRIPTION OF THE PREFERRED EMBODIMENTS

Figure 1:
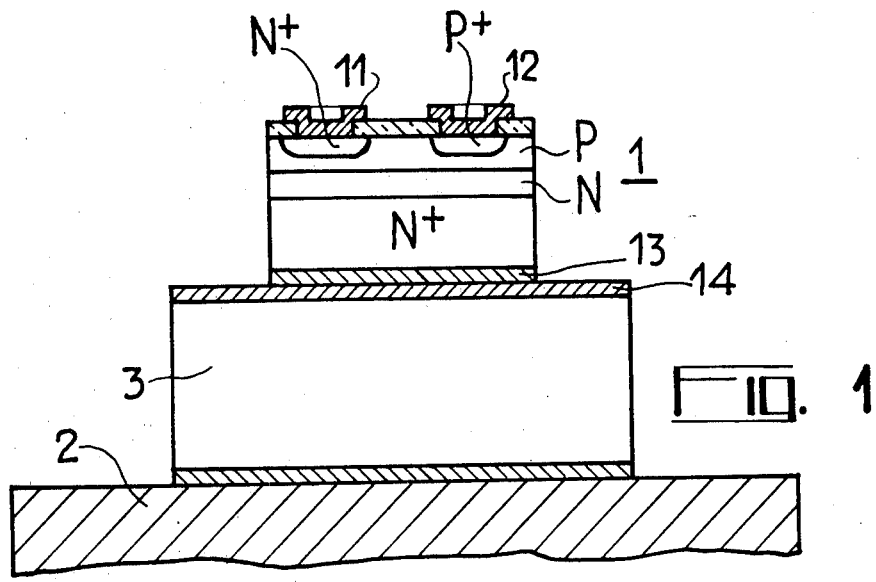
FIG. 1 represents a known device of the type to which the invention is particularly applicable.

Referring now to the drawings, wherein like reference numerals designate identical or corresponding parts throughout the several views, and more particularly to FIG. 1 thereof, there is shown a transistor 1 of type NPN with substrate N+ insulated from a copper base 2 by a disk 3 of beryllium oxide. The thickness of substrate N is, for instance, of the order of about a hundred microns, while the thickness of the disk 3 is of the order of 600 microns. Not shown are the connections soldered to the metallization 11 and 12 of the emitter and base situated on the upper face of the semiconductor block. The metallization 13 of the collector is provided on the lower face of the substrate. The connection (not shown) to this collector is then soldered to a metallization 14 on the disk 3, itself soldered to the metallization 13. Thus, as has already been pointed out, the thermal resistance of the device is relatively high and this limits the usable power.

Figure 2:
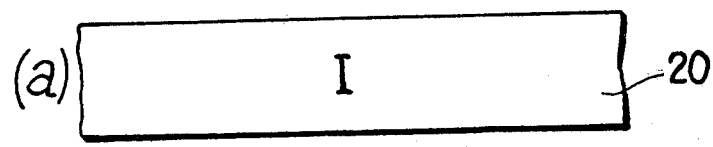
FIG. 2 represents different steps in the method of the invention applied to the fabrication of a transistor.
Figure 2:
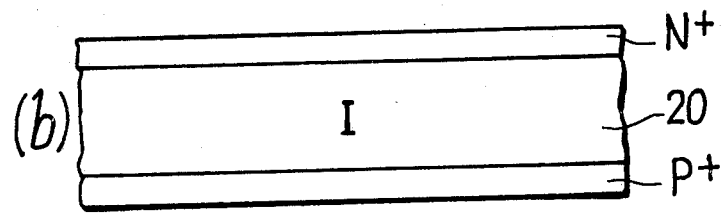
Figure 2:
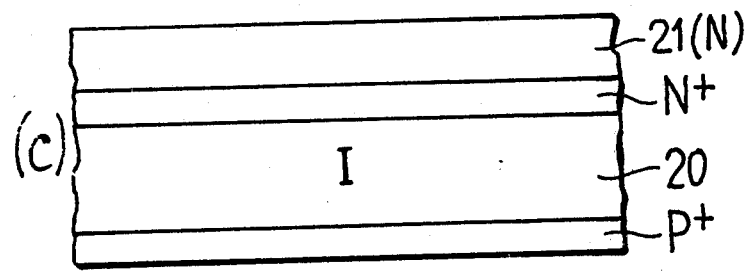
Figure 2:
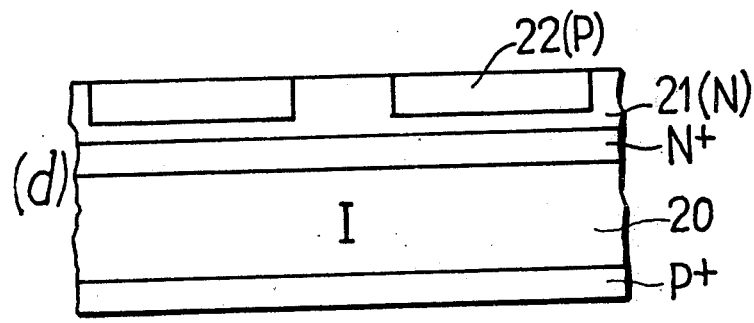
Figure 2:
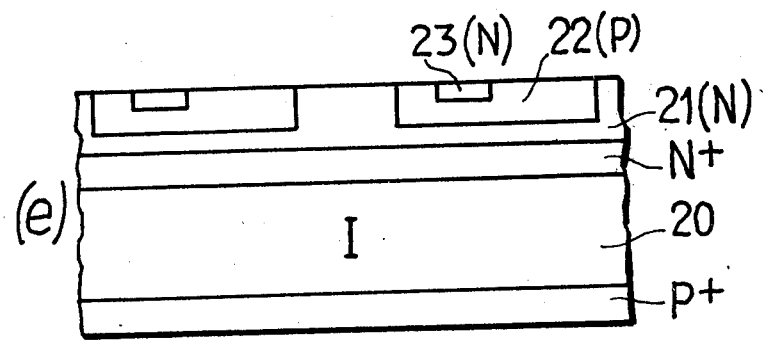

In FIG. 2 there is shown a preferred embodiment of the invention comprising a certain number of steps of collective fabrication of "plane" type transistors (i.e., accessible on only one face of the semiconductor block). One starts with a monocrystalline disk of "quasi-intrinsic" silicon of resistivity above 4000 ohm-cm, of the quality required for the fabrication of "PIN" type diodes.

A section of this disk 20 is shown in FIG. 2(a). Its thickness is, for example, 100 microns or even less.

By diffusion or epitaxy, starting each time from a respective large face of the disk 20, there are created in succession N+ and P+-doped zones about 10 microns thick extending over the entire surface of the disk. In FIG. 2(b) the zones are shown as layers the thickness of which has been intentionally exaggerated for clarity of the drawing.

By epitaxy there is then grown, starting from the N+ layer, a crystalline layer 21 of N-doped silicon (FIG. 2(c)).

By localized diffusions, carried out successively through windows photoengraved in a silica mask (not shown), there are created the P-doped regions 22 and the N-doped regions 23. The P-doped regions penetrate into the layer 21 without reaching the N+ layer (FIG. 2(d)); similarly the regions 23 penetrate into the layer 22 without reaching the layer 21(N) (FIG. 2(e)). An NPN configuration is thus realized. The intermediate steps in which "surdoping" is performed with an impurity of the same type already used, have not been shown. In these steps there are produced:

1. A zone of the layer 21, between two regions 22, penetrating to the N+ layer so as to facilitate making the "collector" contact to each individual transistor later on (N+ doping).

2. A "base" contact zone in the region 22 (P+ doping).

3. An "emitter" contact zone in the region 23 (N+ doping).

After deposit of the metallizations (not shown) the individual transistors are separated by cutting up the disk.

Figure 3:
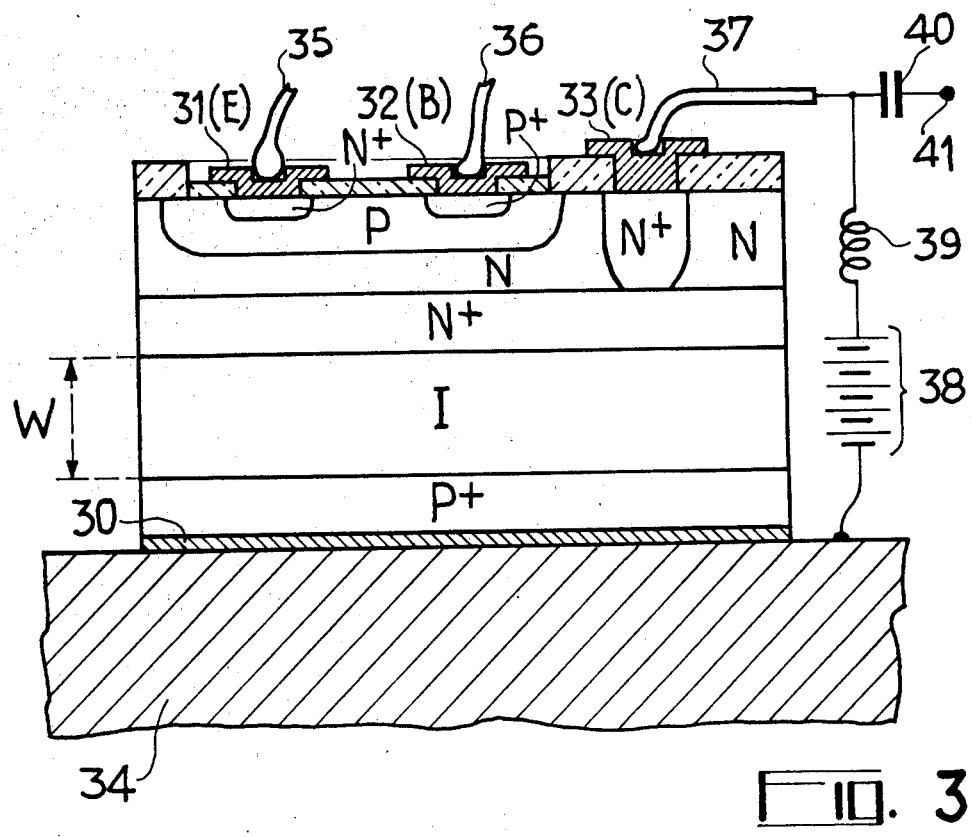
FIG. 3 represents an example of the device of the invention.

Referring to FIG. 3, the metallizations collectively adhered to the disk may comprise the metallizations 31 (emitter), 32 (base) and 33 (collector) on the upper surface and a general metallization 30, applied to the lower surface of the disk which facilitates later soldering by thermocompression or brazing to a copper base 34.

During a final step the connections to the emitter (35), base (36) and collector (37) are soldered on.

As an optional step the transistor is provided with means for reverse biasing the "PIN" type diode formed within the substrate during fabrication. These means may comprise, for instance, a pile battery 38 in series with a suppressor inductance 39 betwen the base 34 and connection 37. The collector output is effected by way of a coupling condenser 40. If the battery voltage is applied in the proper sense and is sufficiently high, it produces a space charge occupying a thickness W in the layer I of the substrate. The result is an electric capacity:

$$C = \frac{KS}{W}$$

where K is the dielectric constant of the intrinsic material and S is the cross-sectional area at the layer I.

The thermal resistance is conveniently reduced in such a device. It can be, with the orders of magnitude already indicated for the different thicknesses, on the order of a third of the thermal resistance of a conventional device.

Obviously, numerous modifications and variations of the present invention are possible in light of the above teachings. It is therefore to be understood that within the scope of the appended claims, the invention may be practiced otherwise than as specifically described.

What is claimed as new and desired to be secured by Letters Patent of the United States is:

1. A method of fabricating semiconductor devices of the type including a semiconductor region constituting the active portion, the functioning of which leads to the dissipation of calories, a semiconductor substrate, and an electrically insulating support for the active portion intended to carry off the calories toward a heat sink by thermal conduction, the method comprising the following steps:

providing a disk of high resistivity semiconductor material;

creating, by diffusion or epitaxy, a pair of highly doped zones of mutually opposed types of conductivity respectively on the two large faces of the disk, leaving therebetween a layer of high resistivity semiconductor material with which the zones form a diode of the "PIN" type;

epitaxially growing a semiconductor layer of the same conductivity type but less strongly doped than one of the zones, starting from the zone;

selectively diffusing impurities into the semiconductor layer to produce a plurality of semiconductor devices;

depositing a metallic film to facilitate connection of the devices to external circuits;

separating the individual devices by cutting up the disks; and mounting each device on a heat-dissipating support.

2. The method recited in claim 1 including the step of incorporating means for reverse-biasing the "PIN" type diode.

3. The method recited in claim 1 wherein the growing step comprises epitaxially growing a semiconductor layer whose resistivity is greater than 4000 ohm-cm. and is of the same conductivity type but less strongly doped than one of the zones, starting from the zone.

* * * * *